(12) United States Patent
Chu et al.

(10) Patent No.: US 12,309,940 B2
(45) Date of Patent: May 20, 2025

(54) ELECTRONIC DEVICE

(71) Applicant: InnoLux Corporation, Miao-Li County (TW)

(72) Inventors: Wei-Cheng Chu, Miao-Li County (TW); Chia-Cheng Liu, Miao-Li County (TW); Ming-Fu Jiang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 109 days.

(21) Appl. No.: 17/968,537

(22) Filed: Oct. 18, 2022

(65) Prior Publication Data

US 2023/0037560 A1 Feb. 9, 2023

Related U.S. Application Data

(63) Continuation of application No. 17/188,554, filed on Mar. 1, 2021, now Pat. No. 11,510,321.

(51) Int. Cl.
*H05K 1/11* (2006.01)
*H05K 3/20* (2006.01)

(52) U.S. Cl.
CPC ............. *H05K 3/20* (2013.01); *H05K 1/111* (2013.01); *H05K 1/118* (2013.01)

(58) Field of Classification Search
None
See application file for complete search history.

(56) References Cited

U.S. PATENT DOCUMENTS

| | | | |
|---|---|---|---|
| 5,903,056 A * | 5/1999 | Canning | H01L 24/83 257/E21.511 |
| 2002/0034620 A1 | 3/2002 | Takezawa et al. | |
| 2005/0211464 A1* | 9/2005 | Byun | H01L 24/83 156/306.6 |
| 2009/0250251 A1* | 10/2009 | Shibata | H01L 23/3114 174/262 |
| 2014/0355226 A1* | 12/2014 | Kim | H05K 3/323 361/768 |
| 2021/0298181 A1 | 9/2021 | Chu et al. | |

FOREIGN PATENT DOCUMENTS

| | | |
|---|---|---|
| CN | 1723590 A | 1/2006 |
| CN | 106465539 A | 2/2017 |
| EP | 0140619 A2 | 5/1985 |
| EP | 0372880 A2 | 6/1990 |
| JP | H0846314 A * | 7/1994 |
| TW | 581800 B | 4/2004 |
| WO | WO2005002002 A1 | 1/2005 |

* cited by examiner

*Primary Examiner* — Timothy J Thompson
*Assistant Examiner* — John B Freal
(74) *Attorney, Agent, or Firm* — MUNCY, GEISSLER, OLDS & LOWE, P.C.

(57) ABSTRACT

A flexible circuit structure includes: a flexible substrate having a surface; a plurality of first pads disposed on the surface; and an insulating layer disposed on the surface and between two adjacent first pads of the plurality of first pads, wherein the insulating layer has a first maximum height in a normal direction of the surface, one of the plurality of first pads has a second maximum height in the normal direction of the surface, and the first maximum height is less than or equal to the second maximum height.

7 Claims, 4 Drawing Sheets

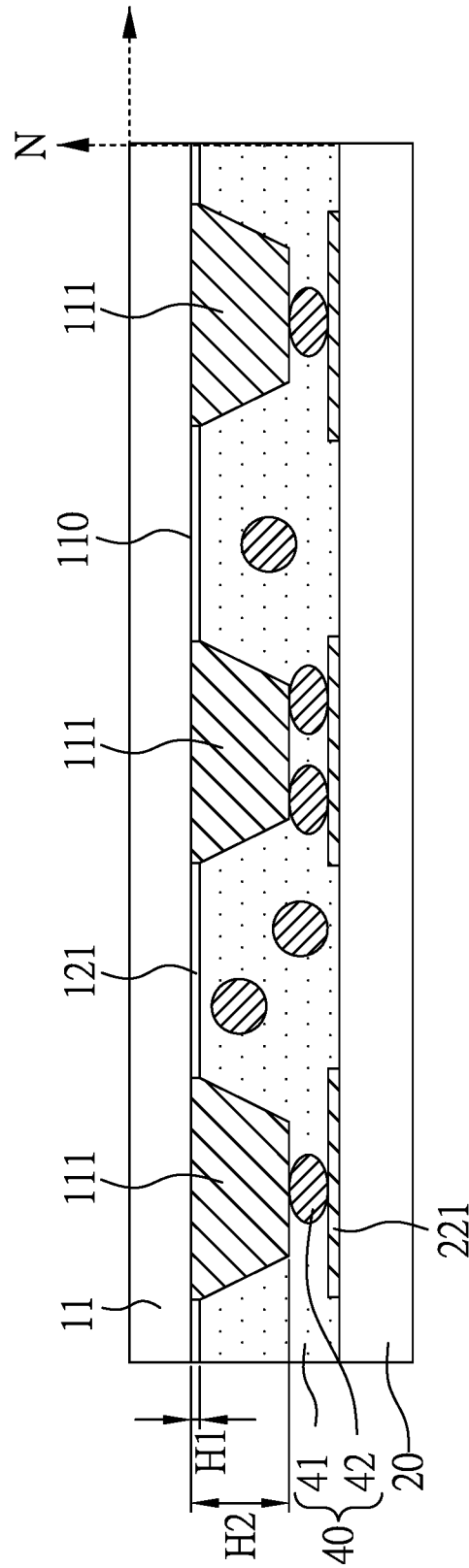
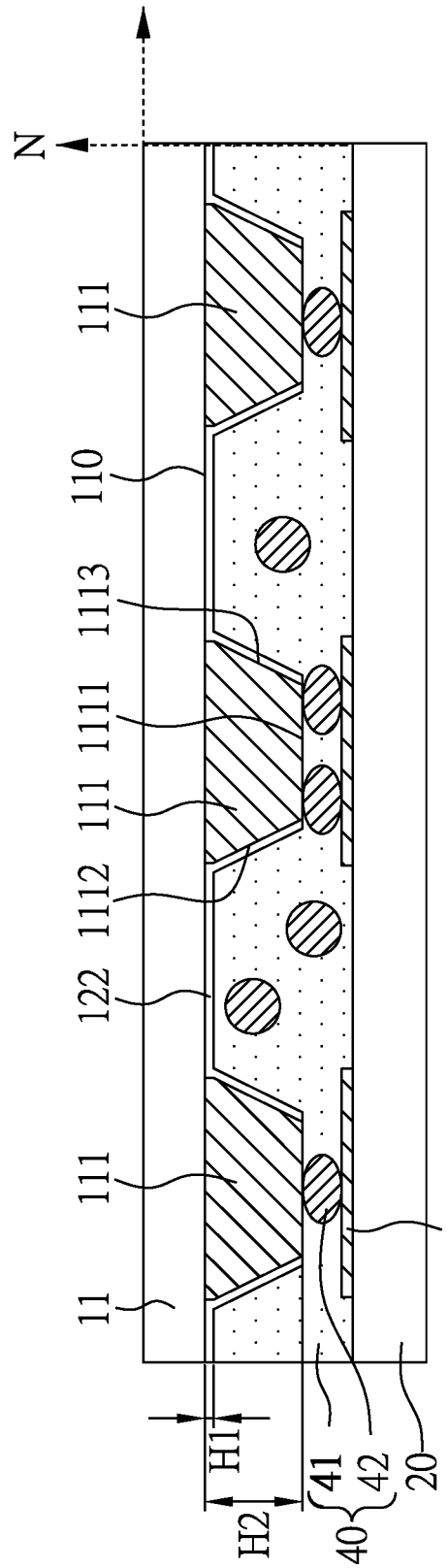

ELECTRONIC DEVICE

CROSS REFERENCE TO RELATED APPLICATION

This application claims the benefits of the Chinese Patent Application Serial Number 202010185773.7, filed on Mar. 17, 2020, the subject matter of which is incorporated herein by reference.

This application is a continuation (CA) of U.S. patent application for "Electronic device", U.S. application Ser. No. 17/188,554 filed Mar. 1, 2021, and the subject matter of which is incorporated herein by reference.

BACKGROUND

1. Field of the Disclosure

The present disclosure relates to an electronic device. More specifically, the present disclosure relates to an electronic device with a flexible circuit structure.

2. Description of Related Art

With the development of electronic products toward narrow borders, it is advantageous in using flexible printed circuit (FPC) boards to connect electronic components. For example, the ability to provide a larger display area is one of the key factors that affect consumers' purchase intentions. The reason why the display devices of a new generation can successfully achieve a borderless design is to use FPC to electrically connect the peripheral driver chips, so that the driver chips that are originally arranged on the periphery of the display panel can thus be arranged on the back side of the display panel, so as to maximize the display area of the display panel.

However, due to the poor adhesion between the polyimide film of the FPC and the metal pads and the adhesive, it is likely to encounter the peeling problems. Therefore, it is desired to provide an electronic device to improve or eliminate the aforementioned problems.

SUMMARY

The present disclosure provides a flexible circuit structure. The flexible circuit structure includes: a flexible substrate having a surface; a plurality of first pads disposed on the surface; and an insulating layer disposed on the surface and between two adjacent first pads of the plurality of first pads, wherein the insulating layer has a first maximum height in a normal direction of the surface, one of the plurality of first pads has a second maximum height in the normal direction of the surface, and the first maximum height is less than or equal to the second maximum height.

Other novel features of the disclosure will become more apparent from the following detailed description when taken in conjunction with the accompanying drawings.

BRIEF DESCRIPTION OF THE DRAWINGS

FIG. 2 is a partial cross-sectional view of an electronic device according to an embodiment of the present disclosure;

FIG. 3 is a partial cross-sectional view of an electronic device according to another embodiment of the present disclosure;

DETAILED DESCRIPTION OF EMBODIMENT

Figure 1:
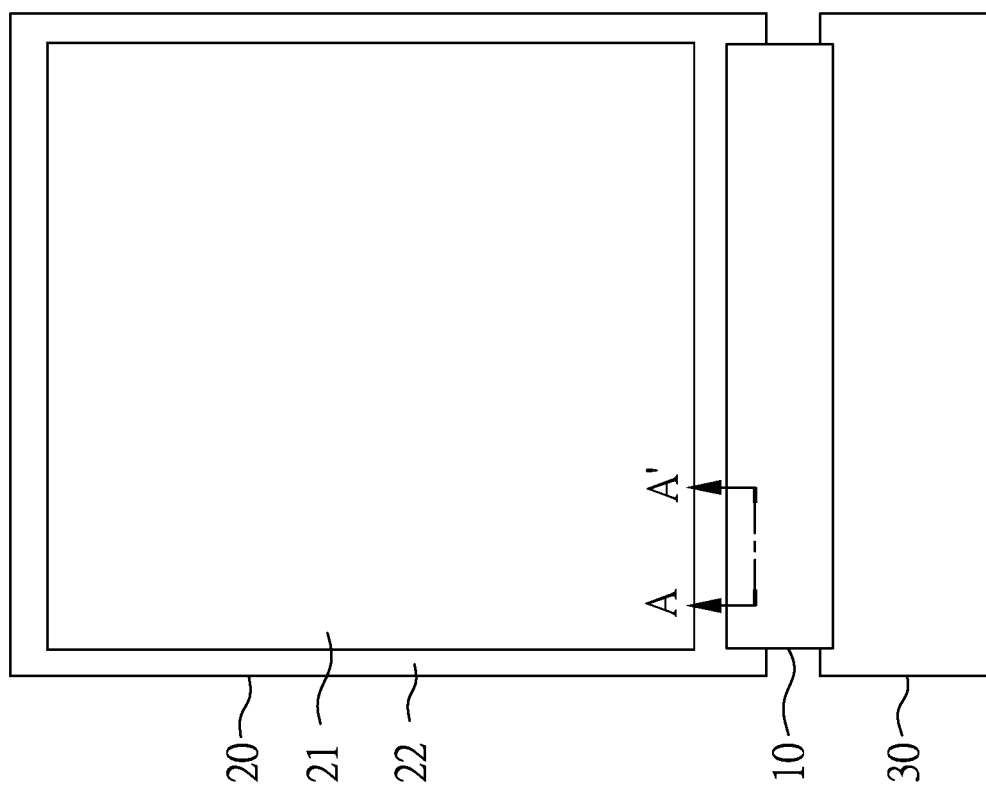
FIG. 1 is a schematic view of an electronic device according to an embodiment of the present disclosure.

The implementation of the present disclosure is illustrated by specific embodiments to enable persons skilled in the art to easily understand the other advantages and effects of the present disclosure by referring to the disclosure contained therein. The present disclosure is implemented or applied by other different, specific embodiments. Various modifications and changes can be made in accordance with different viewpoints and applications to details disclosed herein without departing from the spirit of the present disclosure.

It should be noted that, in the present specification, when a component is described to comprise an element, it means that the component may comprise one or more of the elements, and it does not mean that the component has only one of the element, except otherwise specified.

Ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method. The ordinal numbers are only intended to distinguish a component with a name from another component with the same name.

In addition, the term "on" used herein may refer to two components in direct contact with each other or refer to two components not in direct contact with each other.

In addition, the term "adjacent" used herein may refer to describe mutual proximity and does not necessarily mean mutual contact.

In addition, the term "connect" is intended not only directly connect with other element, but also intended indirectly connect and electrically connect with other element.

In addition, the technical features of the different embodiments disclosed in the present disclosure can be combined to form another embodiment.

In addition, the electronic device disclosed in the present disclosure may include a display device, an antenna device, a sensing device, a touch display device, a curved display device, or a free shape display device, but is not limited thereto. The electronic device may be a bendable or flexible electronic device. The electronic device may include, for example, liquid crystal, light emitting diode, fluorescence, phosphor, other suitable display media, or a combination thereof, but is not limited thereto. The light emitting diode may include, for example, an organic light emitting diode (OLED), a sub-millimeter light emitting diode (mini LED), a micro light emitting diode (micro LED) or a quantum dot (QD) light emitting diode (for example, QLED, QDLED) or other suitable materials or a combination thereof, but is not limited thereto. The display device may include, for example, a tiled display device, but is not limited thereto. The antenna device may be, for example, a liquid crystal antenna, but is not limited thereto. The antenna device may include, for example, a tiled antenna device, but is not limited thereto. It should be noted that the electronic device may be a combination of the foregoing, but is not limited thereto. In addition, the appearance of the electronic device may be rectangular, circular, polygonal, a shape with curved edges, or other suitable shapes. The electronic device may have peripheral systems such as a driving system, a control system, a light source system, a shelf system, etc., to support a display device, an antenna device, or a tiled device. Hereinafter, the display device will be used as an electronic device for illustrative purpose only, but the disclosure is not limited thereto.

FIG. 1 is a schematic view of an electronic device according to an embodiment of the present disclosure. As shown in FIG. 1, the electronic device of this embodiment includes: a flexible circuit structure 10, a substrate 20, and a circuit board 30. The flexible circuit structure 10 has a signal transmission function, and can be connected to the substrate 20 and the circuit board 30, respectively, for transmitting signals between the substrate 20 and the circuit board 30 (for example, gate signals or source signals). However, the present disclosure is not limited to this. The connection structure between the flexible circuit structure 10 and the substrate 20 will be described in detail below as an example.

The substrate 20 can be used for a display device, an antenna device, a sensing device or a tiled device. The substrate 20 may be provided with an active component, and the active component may include a transistor. The substrate 20 may be a flexible substrate or a non-flexible substrate, and the material of the substrate 20 may include, for example, glass, quartz, wafer, sapphire substrate, polycarbonate (PC), polyimide (PI), polypropylene (PP), polyethylene terephthalate (PET), other suitable materials, or a combination thereof. However, the present disclosure is not limited to this.

In this embodiment, the substrate 20 includes a display area 21 and a non-display area 22. The non-display area 22 is disposed beside the display area 21, and the non-display area 22 is electrically connected to the flexible circuit structure 10. FIG. 2 is a partial cross-sectional view taking along the line A-A' in FIG. 1. As shown in FIG. 2, the flexible circuit structure 10 includes a flexible substrate 11 and an insulator, which is an insulating layer 121 in FIG. 2. The flexible substrate 11 has a surface 110 on which a plurality of first pads 111 are disposed. The insulator is disposed on the flexible substrate 11, and is disposed between two adjacent first pads 111 of the plurality of first pads 111.

The material of the flexible substrate 11 may include, for example, polyimide (PI), polycarbonate (PC), polypropylene (PP), polyethylene terephthalate (PET), polyethylene naphthalate (PEN), acrylic, other suitable materials, or a combination thereof. However, the present disclosure is not limited to this.

The flexible circuit structure 10 may have a circuit fabricated on the flexible substrate 11, and the fabricating process may include, for example, a printing process, a chemical vapor deposition (CVD) process, a lithography process, an etching process, and so on. However, the present disclosure is not limited to this. In addition, the first pad 111 is a conductive material, which may include, for example, a metal material, such as Au, Cu, Ni, Ag, Ti, Cr, Mo or Al, an alloy material, a conductive metal oxide, other suitable materials, or a combination thereof. However, the present disclosure is not limited to this.

On the flexible substrate 11 of the flexible circuit structure 10, there may be provided active components such as driving chips, or passive components such as resistors, capacitors or inductors. In some embodiments, the flexible substrate 11 of the flexible circuit structure 10 may be provided with a driving chip. The driving chip is electrically connected to the circuit board 30 and the first pads 111, and the first pads 111 are electrically connected to the conductive circuit of the substrate 20, so that the driving chip is capable of receiving the signals from the circuit board 30 and then transmitting the signals to the substrate 20 through the first pads 111. However, the present disclosure is not limited to this.

The material of the insulator may include non-conductive materials. For example, the insulator may include a polymer material, a silicon oxide compound, a silicon nitride compound, a silicon nitride oxide compound, other suitable materials, or a combination thereof. For example, the polymer material may include polyimide (PI), polyethylene (PE), polyethylene terephthalate (PET), polyamide, other suitable materials, or a combination thereof. The silicon oxide compound may include silicon dioxide. The silicon nitride compound may contain $Si_3N_4$. The silicon nitride oxide compound may contain $Si_2N_2O$. In this embodiment, the material of the insulator is $Si_3N_4$. However, the present disclosure is not limited to this.

The shape of the insulator may be a layered shape, columnar shape, tapered shape, or other suitable shapes, or a combination thereof. In some embodiments, the insulator may be disposed between any two adjacent first pads 111 or on the surface 110 between any two adjacent first pads 111. In some embodiments, the insulator may be disposed at intervals between two adjacent first pads 111 or on the surface 110 between two adjacent first pads 111. In this embodiment, the insulator includes an insulating layer 121, and the insulating layer 121 is disposed on the surface 110 between two adjacent first pads 111. However, the present disclosure is not limited to this.

When flatten the flexible substrate 11, the flexible substrate 11 extends substantially along the first direction. The normal direction N of the flexible substrate 11 is substantially perpendicular to the first direction. The angle between the first direction and the normal direction N is between 80 degrees and 100 degrees. The insulating layer 121 has a first maximum height H1 in the normal direction N of the flexible substrate 11, and each of the plurality of first pads 111 has a second maximum height H2 in the normal direction N of the flexible substrate 11 respectively, wherein the first maximum height H1 may be less than or equal to the second maximum height H2. In this embodiment, the first maximum height H1 is less than the second maximum height H2, but the present disclosure is not limited thereto. The first maximum height H1 may be, for example, between 0.1 μm and 10 μm, between 0.1 μm and 6 μm, between 0.1 μm and 3 μm, or between 0.1 μm and 2 μm. As the first maximum height H1 is getting less and less, it is easier to maintain the flexibility of the flexible circuit structure. The second maximum height H2 may be, for example, between 0.6 μm and 12 μm, between 0.6 μm and 10 μm, between 0.6 μm and 8 μm, between 0.6 μm and 5 μm, between 0.6 μm and 3 μm or between 0.6 μm to 2 μm. However, the present disclosure is not limited to this.

In some embodiment, the insulating layer has a first maximum height in a normal direction of the flexible substrate, and one of the plurality of pads has a second maximum height in the normal direction of the flexible substrate, where the first maximum height is less than or equal to the second maximum height.

In some embodiments, the electronic device includes a conductive adhesive 40 between the flexible circuit structure 10 and the substrate 20. The flexible circuit structure 10 and the substrate 20 are electrically connected through the conductive adhesive 40, wherein the insulating layer 121 is disposed between the flexible substrate 11 and the conductive adhesive 40. The conductive adhesive 40 may include a binder 41 and a plurality of conductive particles 42 dispersed in the binder 41, wherein the binder 41 may include a resin adhesive with moisture-proof, heat-resistant, adhesion and insulating functions, such as epoxy resin or polyimide, etc. The conductive particles 42 may include gold ball particles, such as gold ball particles with a plastic sphere in the center and a nickel layer and a gold layer sequentially coated on the surface of the plastic sphere. The conductive adhesive 40 may include an anisotropic conductive adhesive or an anisotropic conductive film (ACF). However, the present disclosure is not limited to this.

In some embodiments, the flexible circuit structure 10 does not have a pixel unit and therefore does not have a display function, while the display area 21 of the substrate 20 may include a plurality of thin film transistors and a plurality of pixel units to display images. In some embodiments, the non-display area 22 of the substrate 20 may have a plurality of second pads 221, and the second pads 221 may be respectively electrically connected to the thin film transistors or the pixel units. In addition, the second pad 221 may be a conductive material, for example, including metal materials (such as Au, Cu, Ni, Ag, Ti, Cr, Mo or Al), alloy materials, conductive metal oxides (such as ITO, IZO, ITZO, IGZO or AZO), other suitable materials, or a combination thereof. In addition, the thickness of the second pad 221 may be between 0.2 μm and 1.4 μm, between 0.2 μm and 1.2 μm, between 0.2 μm and 1 μm, between 0.2 μm and 0.8 μm, or between 0.2 μm and 0.4 μm. However, the present disclosure is not limited to this.

In some embodiments, the conductive adhesive 40 may be placed on the flexible substrate 11 of the flexible circuit structure 10. For example, the conductive adhesive 40 is placed on the first pad 111 and the insulating layer 121. Then, the substrate 20 is aligned and placed on the conductive adhesive 40, and subsequently the flexible circuit structure 10 and the substrate 20 are pressed together so that the flexible circuit structure 10 and the substrate 20 are fixed to each other. As a result, the conductive particles 42 in the conductive adhesive 40 can be electrically connected to the first pad 111 and the second pad 221, so that signals can be transmitted to the substrate 20 and inputted to the plurality of pixel units. However, the present disclosure is not limited to this.

In this embodiment, the adhering strength of the conductive adhesive 40 to the insulating layer 121 is better than the adhering strength of the conductive adhesive 40 to the flexible substrate 11, so that the adhesion between the flexible circuit structure 10 and the conductive adhesive 40 can be improved. In addition, the flexible circuit structure 10 and the substrate 20 can be connected through the conductive adhesive 40, so as to enhance the adhering strength between the flexible circuit structure 10 and the substrate 20, thereby improving the product reliability of the electronic device.

FIG. 3 is a partial cross-sectional view of an electronic device according to another embodiment of the present disclosure. The electronic device of this embodiment is similar to that disclosed in FIG. 2 except for the following differences.

In this embodiment, each of the plurality of first pads 111 has a contact surface 1111 and two side surfaces 1112, 1113, and the contact surface 1111 is opposite to the surface 110. The contact surface 1111 is provided between the two side surfaces 1112, 1113, and is connected to the two side surfaces 1112, 1113. In this embodiment, the insulator includes an insulating layer 122, and the insulating layer 122 is disposed on the surface 110 between two adjacent first pads 111 and on the two side surfaces 1112, 1113 of the first pad 111. In some embodiments, the insulating layer 122 may be disposed on a partial surface of the surface 110 between two adjacent first pads 111, and extend to a partial surface of one or both of the two side surfaces 1112, 1113 of the first pad 111. In some embodiments, the insulating layer 122 may be disposed on a partial surface of one or both of the two side surfaces 1112, 1113 of the first pad 111.

The insulating layer 122 has a first maximum height H1 in the normal direction N of the flexible substrate 11, and each of the plurality of first pads 111 has a second maximum height H2 in the normal direction N of the flexible substrate 11 respectively, wherein the first maximum height H1 may be less than or equal to the second maximum height H2.

In some embodiments, the insulating layer has a first maximum height in a normal direction of the flexible substrate, and one of the plurality of pads has a second maximum height in the normal direction of the flexible substrate, where the first maximum height is less than or equal to the second maximum height.

The same or similar components in FIG. 3 and FIG. 2 will be given the same or similar reference numerals, and the description for those components will be omitted. In this embodiment, the conductive adhesive 40 may be disposed on the first pad 111 and the insulating layer 122 of the flexible circuit structure 10, and the conductive adhesive 40 is disposed between the flexible circuit structure 10 and the substrate 20, wherein the binder 41 of the conductive adhesive 40 may be adhered to the insulating layer 122 on the surface 110 and the substrate 20, respectively, and the conductive particles 42 in the conductive adhesive 40 may be electrically connected to the first pad 111 and the second pad 221.

In this embodiment, since the adhering strength of the conductive adhesive 40 to the insulating layer 122 is better than the adhering strength of the conductive adhesive 40 to the flexible substrate 11, the flexible circuit structure 10 and the substrate 20 can be connected through the conductive adhesive 40 to improve the adhesion between the flexible circuit structure 10 and the conductive adhesive 40, thereby further enhancing the adhering strength between the flexible circuit structure 10 and the substrate 20. In addition, due to the density of the high-resolution pads being getting higher and higher, the distance between the pads becomes less. In the design of the present disclosure, the insulating layer 122 extends from the surface of the flexible substrate 11 to the side surfaces 1112, 1113 of the first pad so as to avoid the short circuit problem caused by the distance between two adjacent first pads 111 being too small or the density of the conductive particles 42 being too high, thereby improving the product reliability of the electronic device.

Figure 4:
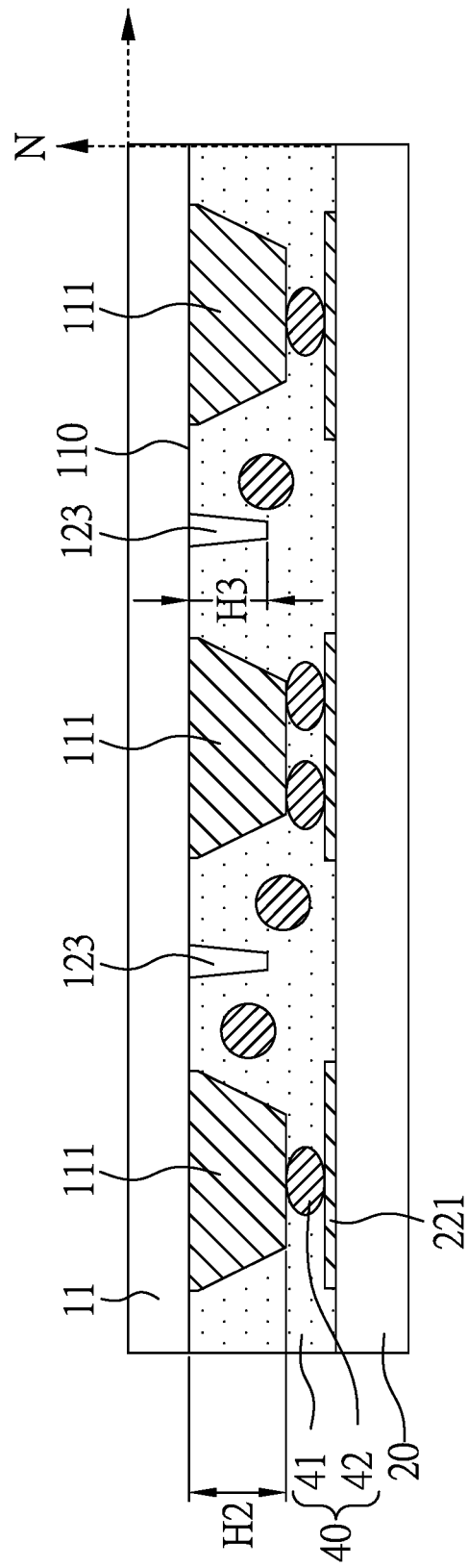
FIG. 4 is a partial cross-sectional view of an electronic device according to another embodiment of the present disclosure.

FIG. 4 is a partial cross-sectional view of an electronic device according to another embodiment of the present disclosure. The electronic device of this embodiment is similar to that disclosed in FIG. 2 except for the following differences.

In this embodiment, the insulator includes an insulating column 123. The insulating column 123 is disposed on the surface 110 of the flexible substrate 11, and is disposed between two adjacent first pads 111. The conductive adhesive 40 is disposed on the surface 110, the insulating column 123, and the first pad 111, and the conductive adhesive 40 is disposed between the flexible circuit structure 10 and the substrate 20, wherein the binder 41 in the conductive adhesive 40 can be adhered to the surface 110, the insulating column 123 and the substrate 20, respectively, and the conductive particles 42 in the conductive adhesive 40 can electrically connect the first pad 111 and the second pad 221. In this embodiment, the insulating column 123 can also separate the conductive particles 42 between the first pads 111 to avoid a short circuit between the first pads 111. In the normal direction N of the flexible substrate 11, the insulating column 123 has a third maximum height H3, and the third maximum height H3 may be less than or equal to the second maximum height H2 of the first pad 111. However, the present disclosure is not limited to this.

In this embodiment, the insulating column 123 can increase the contact area of the conductive adhesive 40 and the flexible circuit structure 10, and the adhering strength of the conductive adhesive 40 to the insulating column 123 is better than the adhering strength of the conductive adhesive 40 to the flexible substrate 11, so as to improve the adhesion of the conductive adhesive 40 to the flexible circuit structure 10, thereby enhancing the product reliability of the electronic device.

Figure 5:
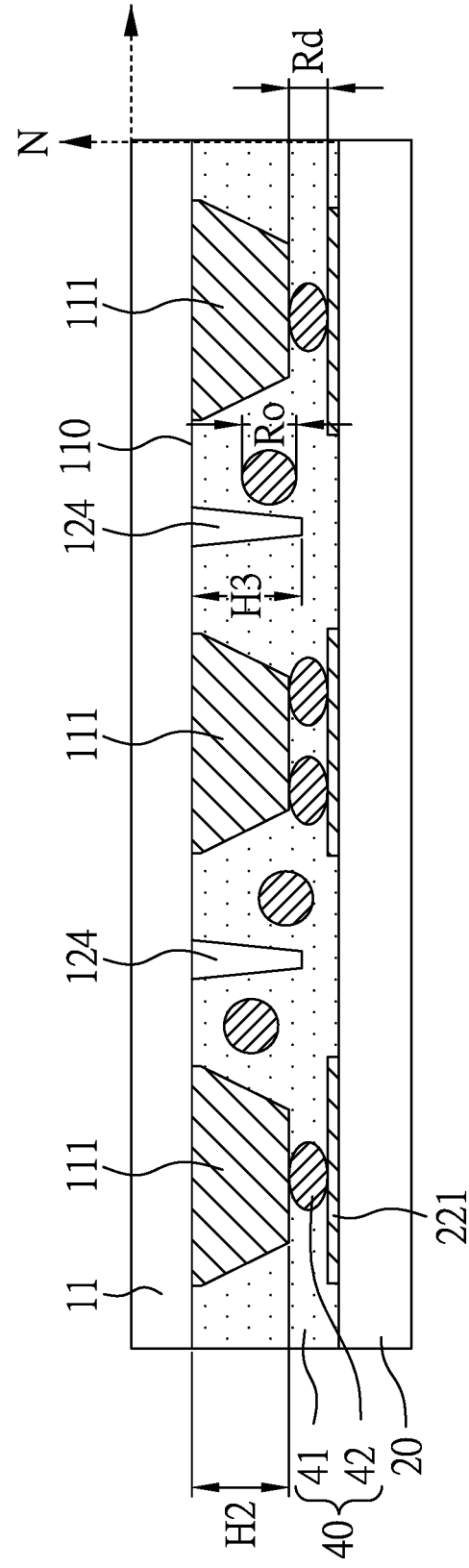
FIG. 5 is a partial cross-sectional view of an electronic device according to another embodiment t of the present disclosure.

FIG. 5 is a partial cross-sectional view of an electronic device according to another embodiment of the present disclosure. The electronic device of this embodiment is similar to that disclosed in FIG. 4, except for the following differences.

In this embodiment, the insulator includes an insulating column 124, and the insulating column 124 is disposed on the surface 110 of the flexible substrate 11 and is disposed between two adjacent first pads 111. In the normal direction N of the flexible substrate 11, the insulating column 124 has a third maximum height H3, and the third maximum height H3 is greater than the second maximum height H2 of the first pad 111. When the flexible substrate 11 is subject to severe sinking and deformation, a rebounding force will be generated, resulting in that the flexible substrate 11 and the conductive adhesive 40 are peeled off With the insulating column 124, a supporting force can be provided during the process of pressing the flexible substrate 11 and the substrate 20 so as to prevent the flexible substrate 11 from sinking and deformation or to prevent the conductive particles 42 from being excessively deformed.

In addition, in this embodiment, the conductive particles 42 in the conductive adhesive 40 have an average particle diameter Ro before being pressed, and the third maximum height H3 is less than the sum of the second maximum height H2 and the average particle diameter Ro, so as to prevent the insulating column 124 from hindering the pressing of the flexible substrate 11 and the substrate 20. In the process of pressing the flexible substrate 11 and the substrate 20, the amount of deformation of the conductive particle 42 between the first pad 111 and the second pad 221 is 30%-70%, that is, after being pressed, the pressed particle diameter Rd of the conductive particle 42 is 30%-70% of the average particle diameter Ro. In some embodiments, the amount of deformation of the conductive particle 42 between the first pad 111 and the second pad 221 may be between 30%-70%, 30%-60% or 30%-50%. If the conductive particle 42 is excessively pressed, the conductive particle 42 will be damaged, and thus the amount of deformation of the conductive particle 42 should not be too large. Therefore, the third maximum height H3 may be between the second maximum height H2 and the sum of the second maximum height H2 and 30%-70% of the average particle diameter Ro. In this embodiment, the average particle diameter Ro can be between 0.3 μm and 7 μm, between 0.3 μm and 5 μm, between 0.3 μm and 4 μm, between 0.3 μm and 3 μm, or between 0.3 μm to 2 μm. However, the present disclosure is not limited to this.

In this embodiment, the insulating column 124 not only provides a supporting force during the pressing process to prevent the flexible substrate 11 from sinking and deformation or to prevent the conductive particles 42 from being excessively deformed, but also increases the contact area between the conductive adhesive 40 and the flexible circuit structure 10. Furthermore, the adhering strength of the conductive adhesive 40 to the insulating column 124 is better than that of the conductive adhesive 40 to the flexible substrate 11, which can improve the adhesion of the conductive adhesive 40 to the flexible circuit structure 10, thereby enhancing the product reliability of the electronic device.

Figure 6:
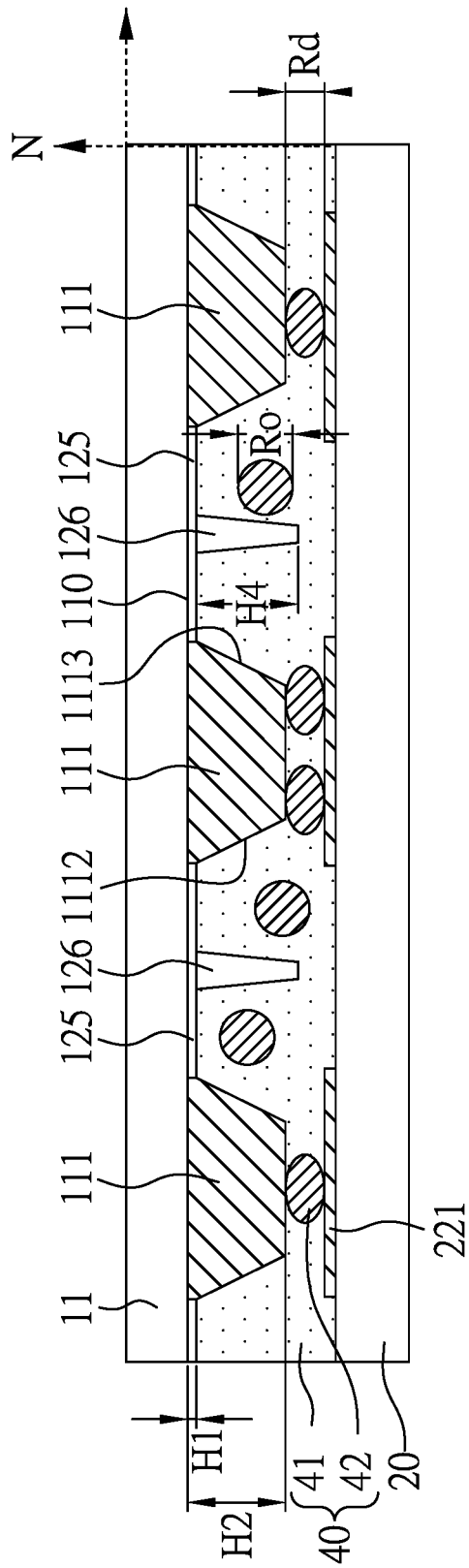
FIG. 6 is a partial cross-sectional view of an electronic device according to another embodiment of the present disclosure.

FIG. 6 is a partial cross-sectional view of an electronic device according to another embodiment of the present disclosure. The electronic device of this embodiment is similar to that disclosed in FIG. 2 or FIG. 5, except for the following differences.

In this embodiment, the insulator includes an insulating layer 125 similar to that shown in FIG. 2 and an insulating column 126 similar to that shown in FIG. 5. The insulating layer 125 is disposed on all of the surface 110 between two adjacent first pads 111. The insulating column 126 is disposed on the insulating layer 125 and between two adjacent first pads 111. The conductive adhesive 40 is disposed on the insulating layer 125, the insulating columns 126, and the first pads 111. The conductive adhesive 40 is disposed between the flexible circuit structure 10 and the substrate 20, wherein the binder 41 in the conductive adhesive 40 can be adhered to the insulating layer 125, the insulating column 126 and the substrate 20, respectively, and the conductive particles 42 in the conductive adhesive 40 can electrically connect the first pad 111 and the second pad 221. However, the present disclosure is not limited to this. In some embodiments, the insulating layer 125 and the insulating columns 126 can be manufactured in the same process. In some embodiments, the insulating layer 125 and the insulating columns 126 can be manufactured in different processes. The insulating layer 125 and the insulating column 126 can be made of the same material or different materials. For example, the insulating layer 125 may be made of an inorganic material, and the insulating column 126 may be made of an organic material, while they are manufactured in different processes. Alternatively the insulating layer 125 and the insulating column 126 are both made of organic materials, and they are manufactured in different processes or in the same process. In some embodiments, the insulating layer 125 and the insulating column 126 are made of the same material. However, the present disclosure is not limited to this. In FIG. 6, the elements that are the same as or similar to those in the aforementioned embodiments will have the same or similar reference numerals, and their description will be omitted. The insulating layer 125 may have a first maximum height H1, and the insulating column 126 may have a fourth maximum height H4, wherein the sum of the first maximum height H1 and the fourth maximum height H4 (that is, the maximum height of the insulator in the normal direction N of the flexible substrate 11) is greater than the second maximum height H2 of the first pad 111. In addition, in this embodiment, before being pressed, the conductive particles 42 in the conductive adhesive 40 have an average particle size Ro, and the sum of the first maximum height H1 and the fourth maximum height H4 is less than the sum of the second maximum height H2 and the average particle diameter Ro. In the process of pressing the flexible substrate 11 and the substrate 20, the amount of deformation of the conductive particle 42 between the first pad 111 and the second pad 221 is 30%-70%, that is, after being pressed, the pressed particle diameter Rd of the conductive particle 42 is 30%-70% of the average particle diameter Ro. In some embodiments, the amount of deformation of the conductive particle 42 between the first pad 111 and the second pad 221 may be between 30%-70%, 30%-60%, or 30%-50%. If the conductive particles 42 are excessively pressed, the conductive particles 42 will be damaged, and thus the amount of deformation of the conductive particle 42 should not be too large. Therefore, the sum of the first maximum height H1 and the fourth maximum height H4 may be between the second maximum height H2 and the sum of the second maximum height H2 and 30%-70% of the average particle diameter Ro. However, the present disclosure is not limited to this.

It can be understood that this embodiment can achieve the effect of FIG. 2 or FIG. 5 of the aforementioned embodiments, and thus a detailed description for the repeated portion is deemed unnecessary.

Figure 7:
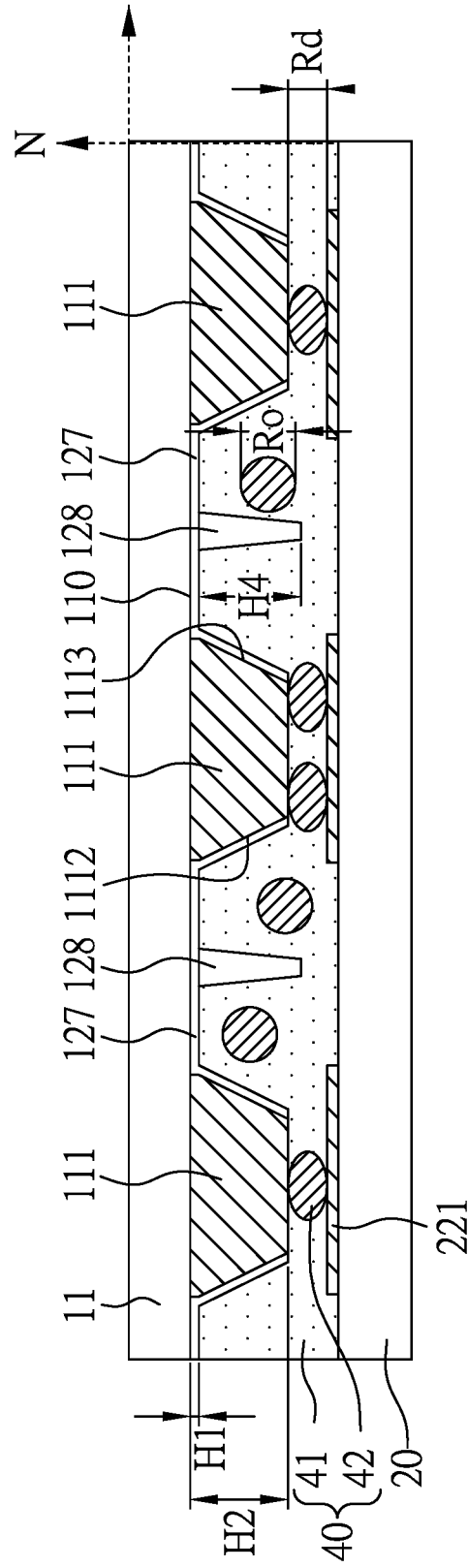
FIG. 7 is a partial cross-sectional view of an electronic device according to another embodiment of the present disclosure.

FIG. 7 is a partial cross-sectional view of an electronic device according to another embodiment of the present disclosure. The electronic device of this embodiment is similar to that disclosed in FIG. 3 or FIG. 5, except for the following differences.

In this embodiment, the insulator includes an insulating layer 127 similar to that shown in FIG. 3 and an insulating column 128 similar to that shown in FIG. 5. The insulating layer 127 is disposed on all of the surface 110 between two adjacent first pads 111 and on the two side surfaces 1112, 1113 of the first pad 111. The insulating column 128 is arranged on the insulating layer 127 and between two adjacent first pads 111. The conductive adhesive 40 is disposed on the insulating layer 127, the insulating columns 128 and first pads 111, and the conductive adhesive 40 is disposed between the flexible circuit structure 10 and the substrate 20, wherein the binder 41 in the conductive adhesive 40 can be adhered to the insulating layer 127, the insulating column 128, and the substrate 20, respectively, and the conductive particles 42 in the conductive adhesive 40 can be electrically connected to the first pad 111 and the second pad 221. However, the present disclosure is not limited to this. In some embodiments, the insulating layer 127 and the insulating column 128 may be manufactured in the same process. In some embodiments, the insulating layer 127 and the insulating column 128 may be manufactured in different processes. The insulating layer 127 and the insulating column 128 may be made of the same material or different materials. For example, the insulating layer 127 may be made of an inorganic material, and the insulating column 128 may be made of an organic material, while they are manufactured in different processes. Alternatively, the insulating layer 127 and the insulating column 128 are both made of organic materials, and they are manufactured in different processes or the same process. In some embodiments, the insulating layer 127 and the insulating column 128 are made of the same material. However, the present disclosure is not limited to this. In FIG. 7, elements that are the same as or similar to those in the aforementioned embodiments will be given the same or similar reference numerals, and their description will be omitted.

It can be understood that this embodiment can achieve the effect of FIG. 3 or FIG. 5 of the aforementioned embodiments, and thus a detailed description for the repeated portion is deemed unnecessary.

The aforementioned embodiments describe in detail the connection of the flexible circuit structure 10 to the substrate 20 and the circuit board 30, but the present disclosure is not limited thereto. Any electronic component that transmits signals through the pads can be connected with the flexible circuit structure 10 of the present disclosure for signal transmission.

Although the present disclosure has been explained in relation to its embodiment, it is to be understood that many other possible modifications and variations can be made without departing from the spirit and scope of the disclosure as hereinafter claimed.

What is claimed is:

1. A flexible electronic device, including:
   a flexible substrate having a surface;
   a plurality of first pads disposed on the surface and having a first side surface and a second side surface;
   an insulating layer disposed on the surface, wherein the insulating layer is disposed between two adjacent first pads of the plurality of first pads and contacts the first side surface and the second side surface,
   a substrate disposed on the surface;
   a plurality of second pads disposed between the surface and the substrate;
   an insulating column disposed between the two adjacent first pads and disposed between the flexible substrate and the substrate; and
   a conductive adhesive disposed on the substrate and between the two adjacent first pads of the plurality of first pads;
   wherein the insulating layer has a first maximum height in a normal direction of the surface, at least one of the plurality of first pads has a second maximum height in the normal direction of the surface, and the first maximum height is less than or equal to the second maximum height;
   wherein the at least one of the plurality of first pads is electrically connected to one of the plurality of second pads, and a length of the one of the plurality of second pads is different from a length of the at least one of the plurality of first pads in a cross section view;
   wherein in the normal direction of the surface, the insulating layer and the plurality of first pads are overlapped.

2. The flexible electronic device of claim 1, wherein the at least one of the plurality of first pads includes an upper surface connected with the first side surface and the second side surface, and the insulating layer is not disposed on the upper surface.

3. The flexible electronic device of claim 1, wherein the conductive adhesive is disposed between the flexible substrate and the substrate.

4. The flexible electronic device of claim 3, wherein the conductive adhesive includes a plurality of conductive particles having an average particle diameter, and a pressed particle diameter of the plurality of conductive particles is 30%-70% of the average particle diameter.

5. The flexible electronic device of claim 4, wherein the substrate includes a display area and a non-display area, the plurality of second pads are disposed on the non-display area of the substrate, and one of the plurality of conductive particles in the conductive adhesive is electrically connected to the at least one of the plurality of first pads and the one of the plurality of second pads.

6. The flexible electronic device of claim 1, further including a light emitting diode.

7. The flexible electronic device of claim 6, wherein the light emitting diode includes an organic light emitting diode.

* * * * *